(12) United States Patent
Park et al.

(10) Patent No.: US 6,977,197 B2
(45) Date of Patent: Dec. 20, 2005

(54) SEMICONDUCTOR DEVICES HAVING DRAM CELLS AND METHODS OF FABRICATING THE SAME

(75) Inventors: Je-Min Park, Gyeonggi-do (KR); Yoo-Sang Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/884,040

(22) Filed: Jul. 2, 2004

(65) Prior Publication Data

US 2005/0003646 A1 Jan. 6, 2005

(30) Foreign Application Priority Data

Jul. 3, 2003 (KR) .................... 10-2003-0045009

(51) Int. Cl.⁷ .......................................... H01L 21/8242
(52) U.S. Cl. ..................... 438/239; 438/672; 257/305
(58) Field of Search ..................... 257/296, 301–310; 438/153, 200, 238–253, 381–396, 669–675

(56) References Cited

U.S. PATENT DOCUMENTS 6,136,643 A 10/2000 Jeng et al.
2004/0266101 A1 * 12/2004 Park et al. .................. 438/253

FOREIGN PATENT DOCUMENTS

KR 010005108 1/2001
KR 1020020088980 11/2002

OTHER PUBLICATIONS

English language abstract of Korean Publication No. 1020020088980.
English language abstract of Korean Publication No. 010005108.

* cited by examiner

Primary Examiner—David Nelms
Assistant Examiner—Calvin Lee
(74) Attorney, Agent, or Firm—Marger Johnson & McCollom, P.C.

(57) ABSTRACT

The present invention discloses a semiconductor device, comprising: bit line landing pads formed over a semiconductor substrate; storage landing pads formed on both sides of the bit line landing pads; a bit line interlayer insulator formed over the whole surface of the semiconductor substrate having the landing pads; a plurality of parallel bit line patterns arranged on the bit line interlayer insulator; bit line insulating layer patterns filling in gate regions between the bit line patterns; upper contact holes formed in the bit line insulating layer patterns to expose side walls of the bit line patterns and located higher than upper surfaces of the bit line patterns; contact hole spacers covering the side walls of the upper contact holes; lower contact holes penetrating the bit line insulating layer patterns and the bit line interlayer insulator below holes surrounded by the contact hole spacers to expose the storage node landing pads and self-alighed with the upper contact holes; and storage node contact plugs filling in the upper and lower contact holes.

7 Claims, 18 Drawing Sheets

SEMICONDUCTOR DEVICES HAVING DRAM CELLS AND METHODS OF FABRICATING THE SAME

This patent application claims priority from Korean Patent Application No. 10-2003-45009 filed on Jul. 03, 2003, the contents of which are hereby incorporated by reference in there entirety.

BACKGROUND OF INVENTION

1. Field of the Invention

The present invention relates to semiconductor devices and methods of fabricating the same, more particularly to semiconductor devices having DRAM cells and methods of fabricating the same.

2. Description of Related Art

In general, a semiconductor device having DRAM cells comprises gate patterns and capacitors on one active region selected from a cell array region. One cell includes one gate pattern and one capacitor adjacent to the gate pattern and has one address on the cell array region. The gate pattern controls the flow of data which moves through a semiconductor substrate, and the capacitor is a place where the data are stored. One bit line pattern is formed on the active region and electrically contacts the active region. The bit line pattern is a line which allows data to be moved between the cell array region and a peripheral circuit region. There have been performed studies on a capacitor over bit-line (COB) structure together with the bit line pattern. In the COB structure, the gate pattern, the capacitor and the bit line pattern arranged on the active region are insulated from each other by an insulating layer. At this time, one of DRAM cells has one contact hole in the insulating layer so that a landing pad, which is a node of the capacitor, contacts the active region. The contact hole can include of one or more holes, and also the capacitor contact landing pad can include one or more pads in accordance with the number of the holes.

But the more a high integration of the semiconductor device is required, the more reduction in a design rule of the semiconductor device is considered. The reduction in a design rule leads to small feature size of the active region, the contact hole, the gate pattern, the bit line pattern and the capacitor with the landing pad. This makes contact resistance between the capacitor contact landing pad and the active region and resistance of the gate and bit line patterns larger and also reduces a capacitance of the capacitor. An issue of design rule reduction can be solved by using upgraded semiconductor manufacturing equipments more or less, but it is very difficult to increase a contact area between the capacitor and the landing pad. A method of forming the COB structure comprises the steps of forming a storage node interlayer insulating layer on the whole surface of a semiconductor substrate having a landing pad in an insulating layer, forming a storage node hole in the storage node interlayer insulating layer, and forming a storage node by molding a doped poly silicon layer in the storage node hole. Here, the storage node hole exposes only to an upper surface of the landing pad, and an area of the side wall of the storage node corresponds to a height of the storage node hole. Therefore, due to the reduction of the design rule, a diameter of the storage node hole gets become smaller, and a size of contact area between the storage node hole and the landing pad gets become smaller. As a result, the contact resistance between the storage node and the landing pad is higher, and the storage node may be leaned or collapsed. This causes refresh fail of the DRAM cell resulting from the high contact resistance, and physical or electrical short by the storage node.

On the other hand, U.S. Pat. No. 6,136,643 to Jeng, et al discloses a method of manufacturing a capacitor having a COB structure. According to the '643 patent, the method includes forming DRAM cells having active regions, gate patterns, bit line patterns and a capacitor of a COB structure. A third etching stopper is formed to cover side walls of the bit line patterns, a third sacrificial insulating layer exist in the bit line patterns. At this time, photolithography and etching process are performed two times to form an opening portion penetrating the third sacrificial insulating layer between bit line patterns. However, during the performance of the etching process two times, the third etching stopper can be overly etched to thereby expose the side walls of the bit line patterns. Therefore, in the process of forming a lower electrode of the capacitor, the lower electrode and the bit line patterns may form a short circuit through the opening portion.

SUMMARY OF THE INVENTION

In one embodiment, a semiconductor device comprises bit line landing pads and storage landing pads disposed on both sides of the bit line landing pads overlying a semiconductor substrate. A bit line interlayer insulating layer overlies the bit line and storage landing pads. A plurality of bit line patterns disposed on the bit line interlayer insulating layer. The bit line patterns each include a bit line and a bit line capping layer pattern. Line insulating layer patterns placed on a top surface of the bit line interlayer insulating layer. Upper contact holes placed in a region between the bit line patterns and higher than upper surfaces of the bit lines. Contact hole spacers cover the side walls of the upper contact holes. Lower contact holes are self-aligned with the upper contact holes and extend through the line insulating layer patterns and the bit line interlayer insulating layer, thereby exposing the storage node landing pads. Storage node contact plugs fill the upper and lower contact holes.

According to an aspect of the invention, storage node holes are diagonally placed on a semiconductor substrate having an active region to be sufficiently overlapped with storage node contact plugs, thereby improving a performance of a semiconductor device having DRAM cells.

BRIEF DESCRIPTION OF THE DRAWINGS

Exemplary embodiments of the invention will be readily apparent to those of ordinary skill in the art upon review of the detailed descriptions that follows when taken in conjunction with the accompanying drawings, in which like reference numerals denote like parts.

DETAILED DESCRIPTION OF PREFERRED EMBODIMENTS

Reference will now be made in detail to exemplary embodiments of semiconductor devices having DRAM cells and methods of fabricating the same of the invention, which are illustrated in the accompanying drawings.

Figure 1:
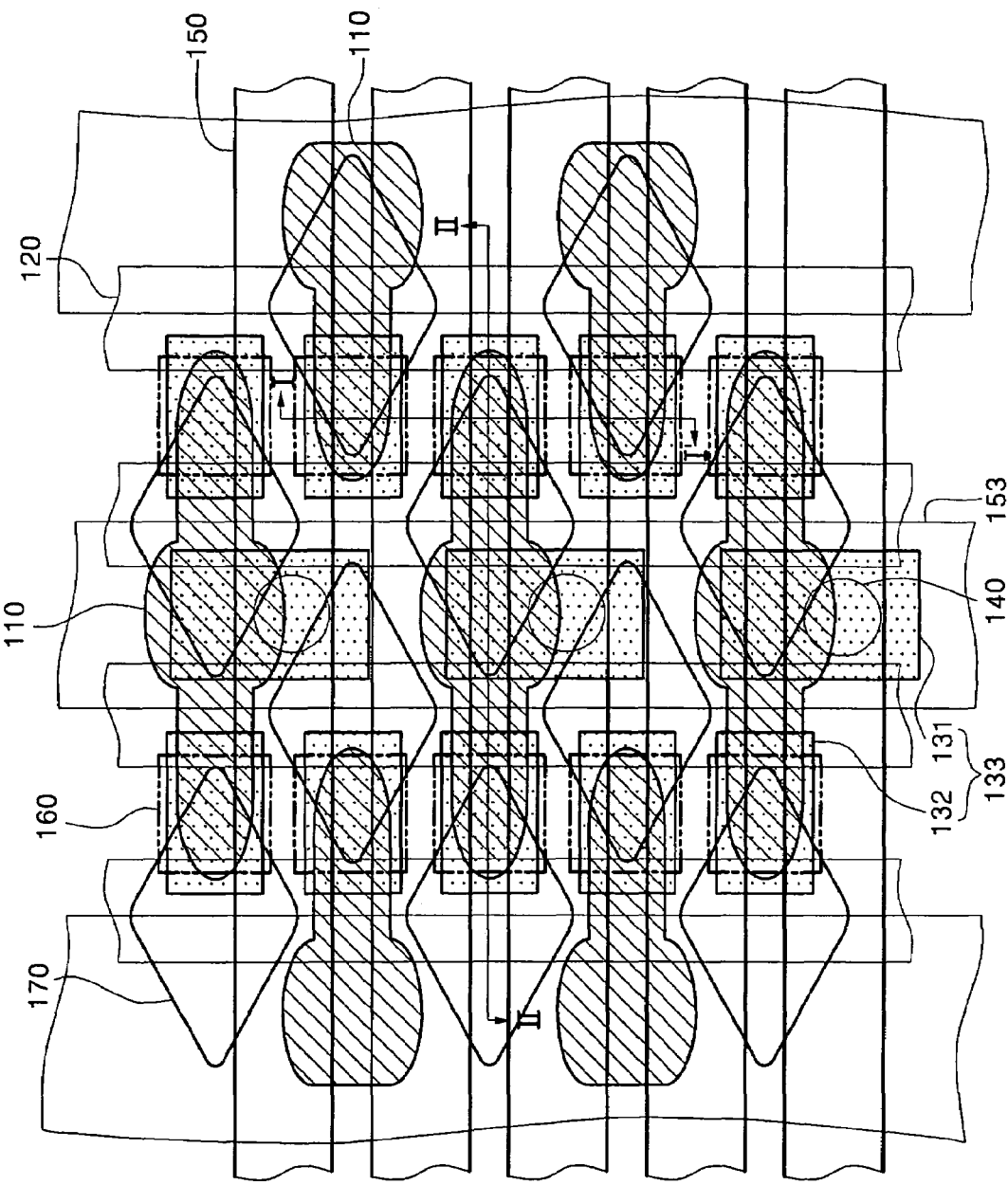
FIG. 1 is a plan view illustrating a semiconductor device according to the invention.
Figure 2:
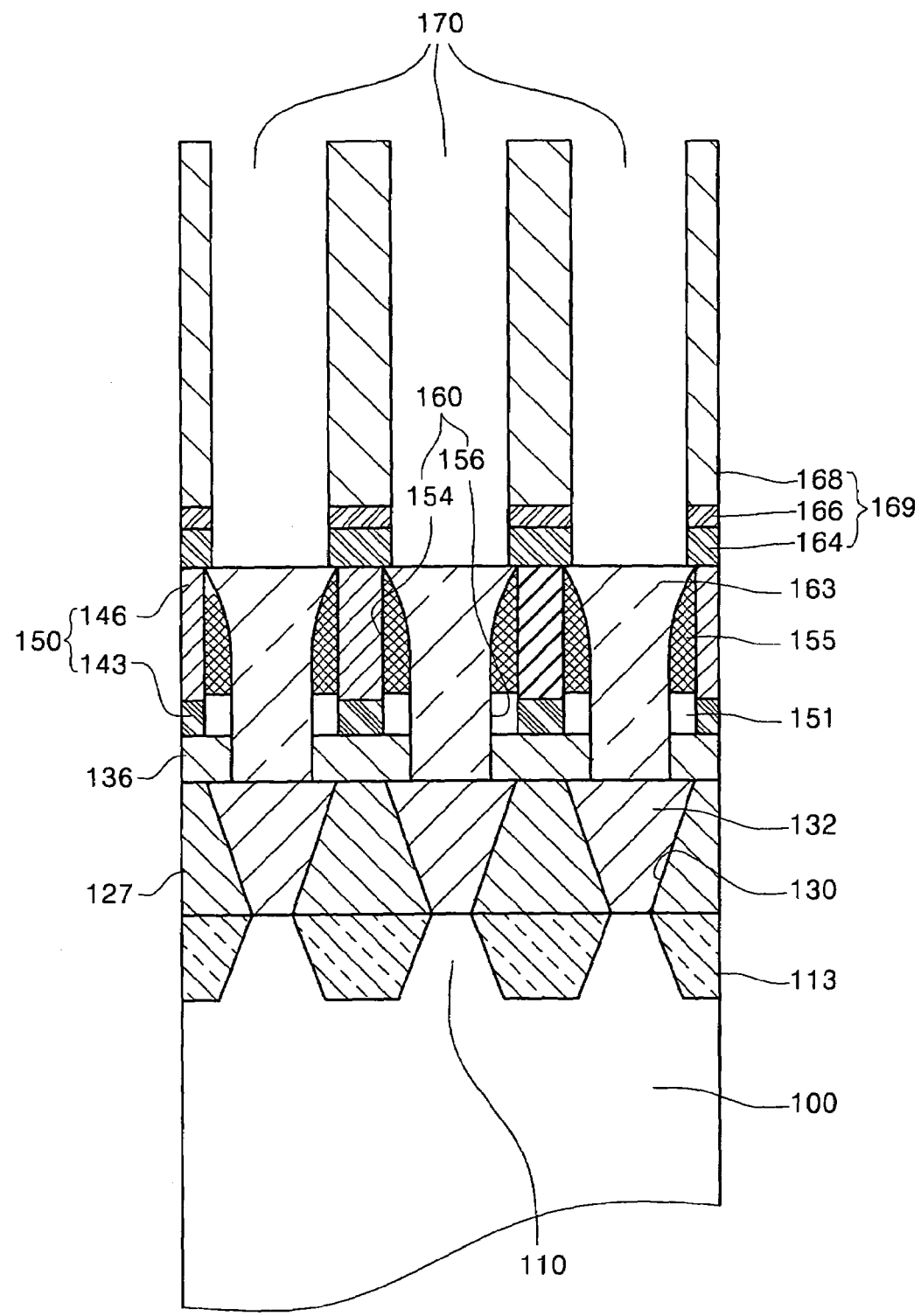
FIG. 2 is a cross-sectional view taken along line I–I' of FIG. 1.
Figure 3:
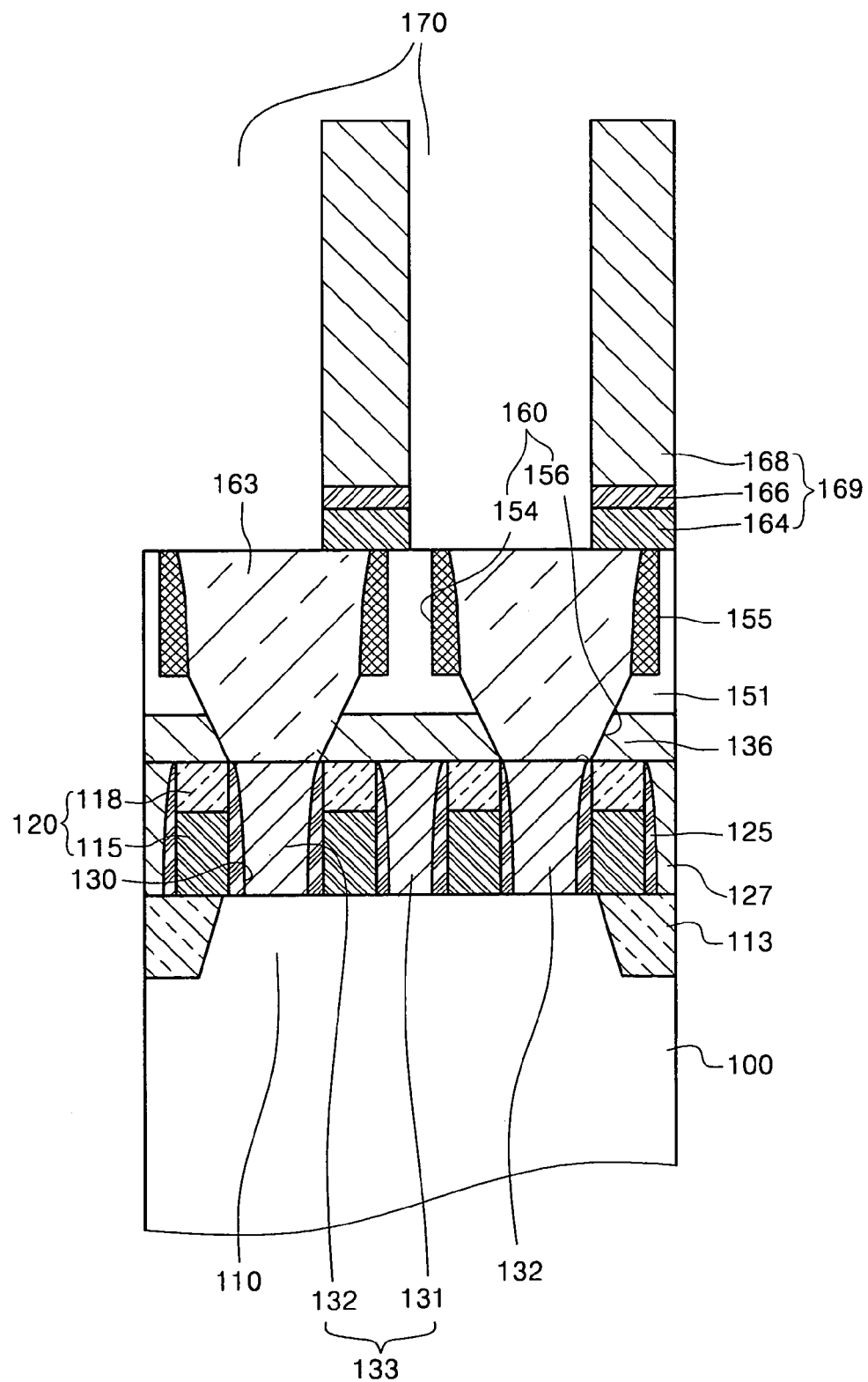
FIG. 3 is a cross-sectional view taken along line II–II' of FIG. 1.

FIG. 1 is a plan view illustrating a semiconductor device according to the invention, and FIGS. 2 and 3 are cross-sectional views taken along line I–I' and II–II' of FIG. 1, respectively.

Referring to FIGS. 1 to 3, active regions 110 of straight type isolated by a trench isolating layer 113 are placed on a semiconductor substrate 100. Gate patterns 120 going across the active regions 110 are arranged in parallel at a regular interval. Each of the gate patterns 120 includes a gate 115 and a gate capping layer pattern 118 stacked thereon, and the gate 115 comprises a doped poly silicon layer or a polycide layer. The gate capping layer pattern 118 comprises a silicon nitride layer. Gate spacers 125 are placed on side walls of the gate patterns 120. A pad interlayer insulating layer 127 covers the whole surface of the semiconductor substrate 100 having the gate patterns 120, and pad holes 130 are placed on a predetermined region between the gate patterns 120 to penetrate the pad interlayer insulating layer 127. Landing pads 133 are two-dimensionally placed on the semiconductor substrate 100 and can be divided into bit line landing pads 131 and storage node landing pads 132 as shown in FIG. 1. The bit line landing pads 131 are placed in a row at central portions of the active regions 110 to run in the same direction as the gate patterns 120. The storage node landing pads 132 are placed in a row at both edge portions of the active regions 110 to run in the same direction as the gate patterns 120. The landing pads 133 comprise a doped poly silicon layer. A bit line interlayer insulating layer 136 is placed over the semiconductor substrate 100 having the landing pads 133 to expose the storage node landing pads 132. Preferably, the bit line interlayer insulating layer 136 comprises an oxide layer.

Next, bit line contact holes 140 of FIG. 1 are placed in the bit line interlayer insulating layer 136, exposing a predetermined portion of the bit line landing pads 131. A plurality of bit line patterns 150 are placed on a predetermined region of the bit line interlayer insulating layer 136 to fill the bit line contact holes 140. At this time, the bit line patterns 150 are placed in parallel in the direction perpendicular to the gate patterns 120. Each of the bit line patterns 150 includes a bit line 143 and a bit line capping layer pattern 146 stacked in sequence. The bit line 143 includes a tungsten W layer, and the bit line capping layer pattern 146 includes a silicon nitride layer. Line insulating layer pattern 151 is placed on side wall of the bit line 143 and on the surface of the bit line interlayer insulating layer 136 in the direction perpendicular to the bit line patterns 150, and on the surface of the bit line interlayer insulating layer 136 in the direction parallel to the bit line patterns 150 at the junctions between the gate and bit line patterns. The line insulating layer pattern 151 has an etching selectivity ratio different from the bit line capping layer pattern 146 but the same etching selectivity ratio as the bit line interlayer insulating layer 136.

Also, buried contact holes 160 are placed in regions surrounded by the bit line patterns 150 and the gate patterns 120, or the bit line patterns 150 and hard mask patterns 153 as shown in FIG. 1. The hard mask patterns 153 are placed in the direction perpendicular to the bit line patterns 150 to overlap the bit line landing pads 131. Each of the buried contact holes 160 comprise upper and lower contact holes 154, 156. The upper contact hole 154 is placed in the upper side of the buried contact hole 160 between the bit capping insulating layer 146. The upper contact hole 154 is self-aligned by the hard mask patterns 153 of FIG. 1 and the bit line patterns 150 to maximize an area exposing region between the bit lines 143, in consideration of exposure of the bit line landing pads 131. A bottom surface of the upper contact hole 154 is placed higher than the upper surface of the bit line 143. A contact hole spacer 155 is placed on side wall of the upper contact hole 154. The contact hole spacer 155 has the etching selectivity ratio different from the line insulating layer pattern 151. Preferably, the contact hole spacers 155 is a silicon nitride layer. The lower contact hole 156 is placed in the lower side of the buried contact hole 160 between the line insulating layer pattern 151 and the bit line interlayer insulating layer 136. The lower contact hole 156 exposes a portion of the storage node landing pads 132 and has inclined side wall in the same direction as the bit line patterns 150.

Finally, the buried contact holes 160 are filled with storage node contact plugs 163. Storage node holes 170, which are in storage node interlayer insulating layer 169, are placed to expose the storage node contact plugs 163, the contact hole spacers 155 and the line insulating layer patterns 151. The storage node interlayer insulating layer 169 includes a protection layer 164, an etching stopper layer 166 and a molding layer 168 stacked in sequence. The etching stopper layer 166 has an etching selectivity ratio with respect to the protection layer 164 and the molding layer 168. Preferably, the protection layer 164 and the molding layer 168 comprise an oxide layer, and the etching stopper layer 166 comprises a silicon nitride layer. The storage node holes 170 are arranged between the bit line patterns 150 to place over the bit line landing pads 131 and the storage node landing pads 132. At this time, the storage node holes 170 are arranged in a diagonal direction and have a square shape or a diamond shape.

Now, the method of fabricating the semiconductor device of the invention is explained with reference to FIGS. 4 to 19. FIGS. 4, 6, 8, 10, 12, 14, 16 and 18 are cross-sectional views taken along line I–I' of FIG. 1, respectively. FIGS. 5, 7, 9, 11, 13, 15, 17 and 19 are cross-sectional views taken along line II–II' of FIG. 1, respectively.

Figure 4:
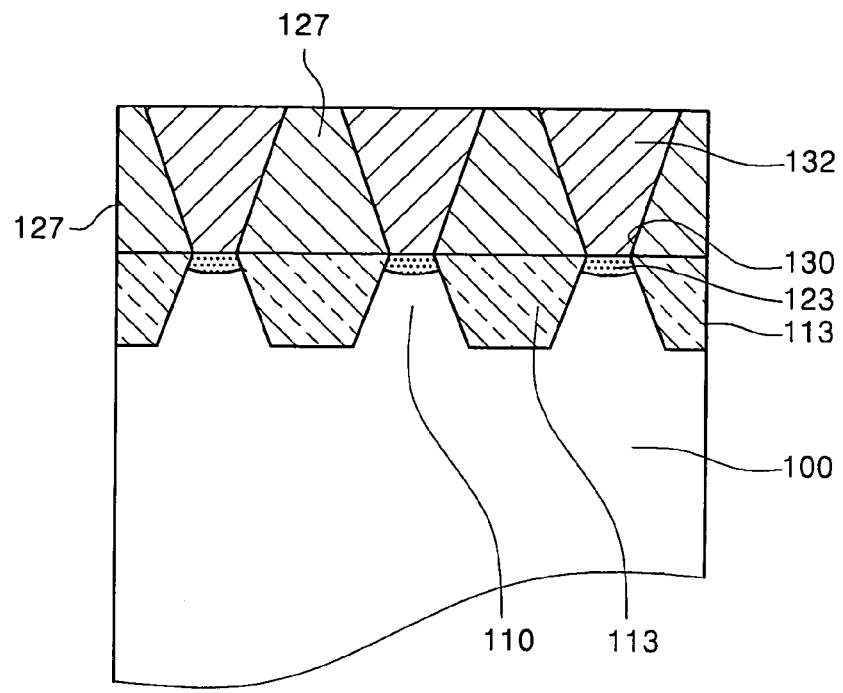
FIGS. 4, 6, 8, 10, 12, 14, 16 and 18 are cross-sectional views illustrating a process of fabricating the semiconductor device, taken along line I–I' of FIG. 1, respectively.
Figure 5:
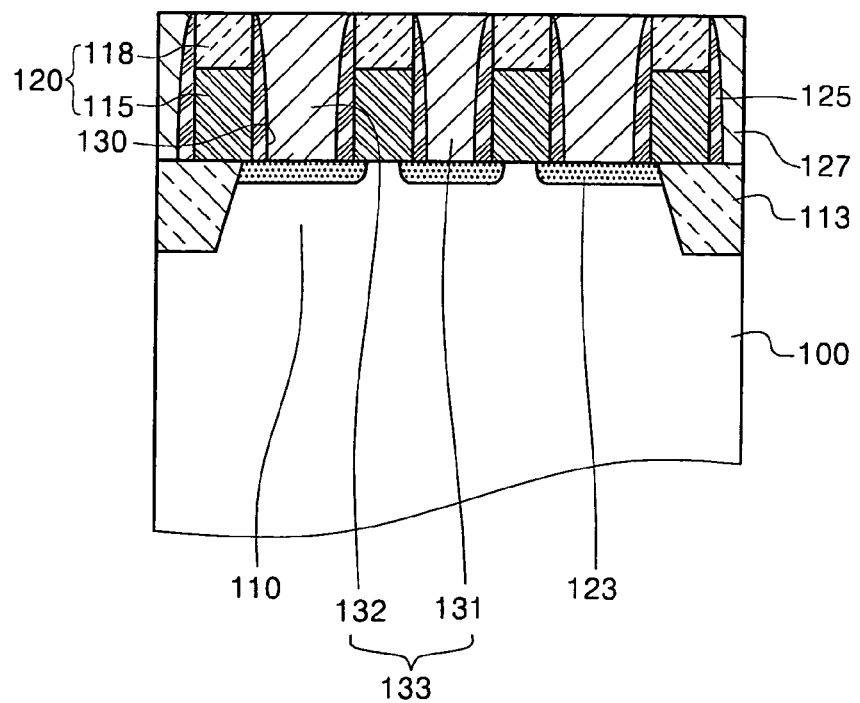
FIGS. 5, 7, 9, 11, 13, 15 17 and 19 are cross-sectional views illustrating a process of fabricating the semiconductor device, taken along line II–II' of FIG. 1, respectively.

Referring to FIGS. 4 and 5, gate patterns 120 are formed to traverse active regions 110 of a semiconductor substrate 100 having a trench isolating layer 113. Using the gate patterns 120 as a mask, an ion doping process is performed to form impurity regions 123 in the semiconductor substrate 100. Each of the gate patterns 120 is formed of a gate 115 and a gate capping layer pattern 118 in sequence. Preferably, the gate 115 is formed of a doped poly silicon layer, and the gate capping layer pattern 118 is formed of a silicon nitride layer. The impurity regions 123 overlap the gate patterns 120. Gate spacers 125 are formed on side walls of the gate patterns 120. Preferably, the gate spacer 125 is formed of a silicon nitride layer.

A pad interlayer insulating layer 127 covers the whole surface of the semiconductor substrate 100 having the gate spacers 125. The pad interlayer insulating layer 127 is etched until the gate capping layer pattern 118 is exposed, thereby planarizing the semiconductor substrate 100. The pad interlayer insulating layer 127 is preferably formed of an insulating layer having an etching selectivity ratio different from the gate capping layer pattern 118. The pad interlayer insulating layer 127 is formed of an oxide layer. Next, pad holes 130 are formed between the gate patterns 120 to penetrate the pad interlayer insulating layer 127, and the pad holes 130 is filled with landing pads 133. The landing pads 133 are two-dimensionally formed along the active regions 110 and are formed from bit line landing pads 131 and storage node landing pads 132. here, the storage node landing pads 132 are formed on both sides of the bit line landing pads 131.

Figure 6:
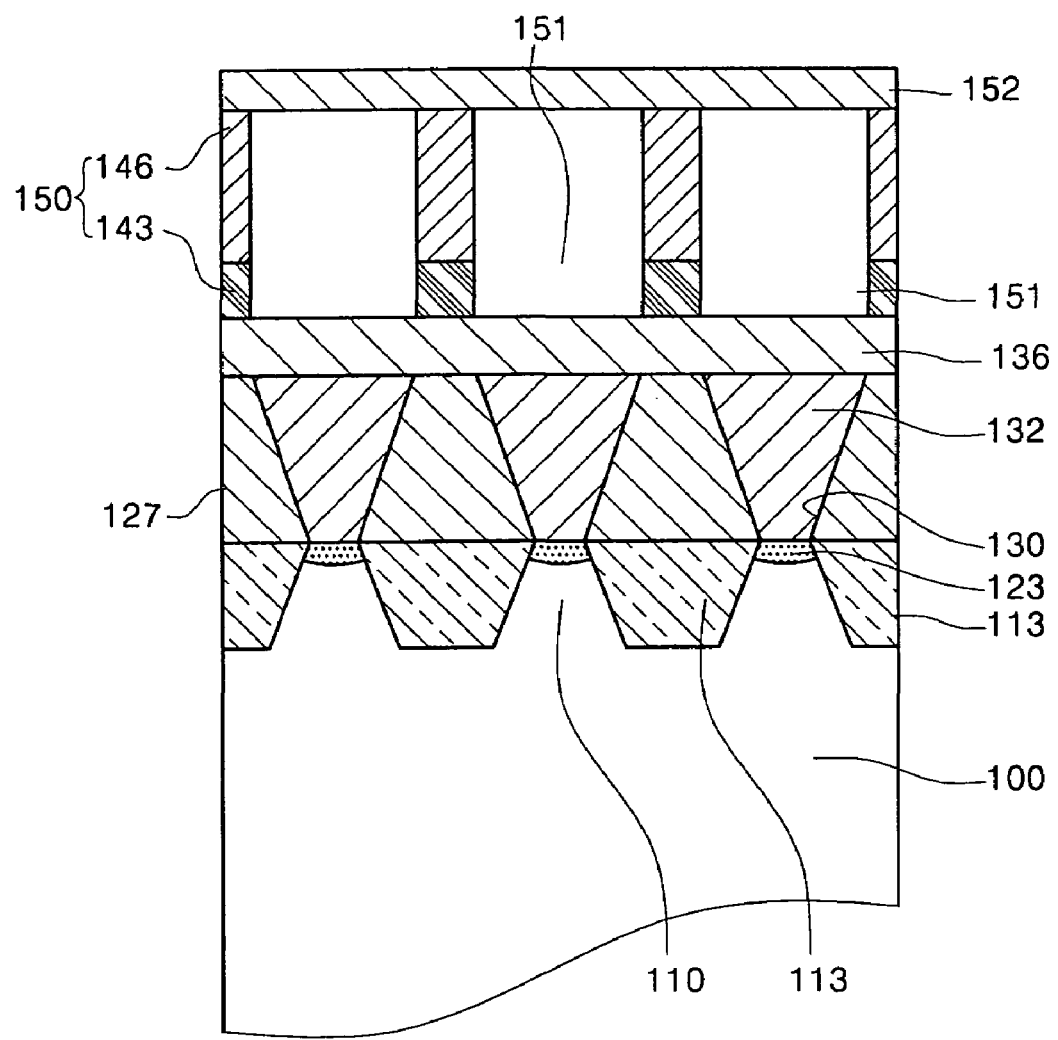
Figure 7:
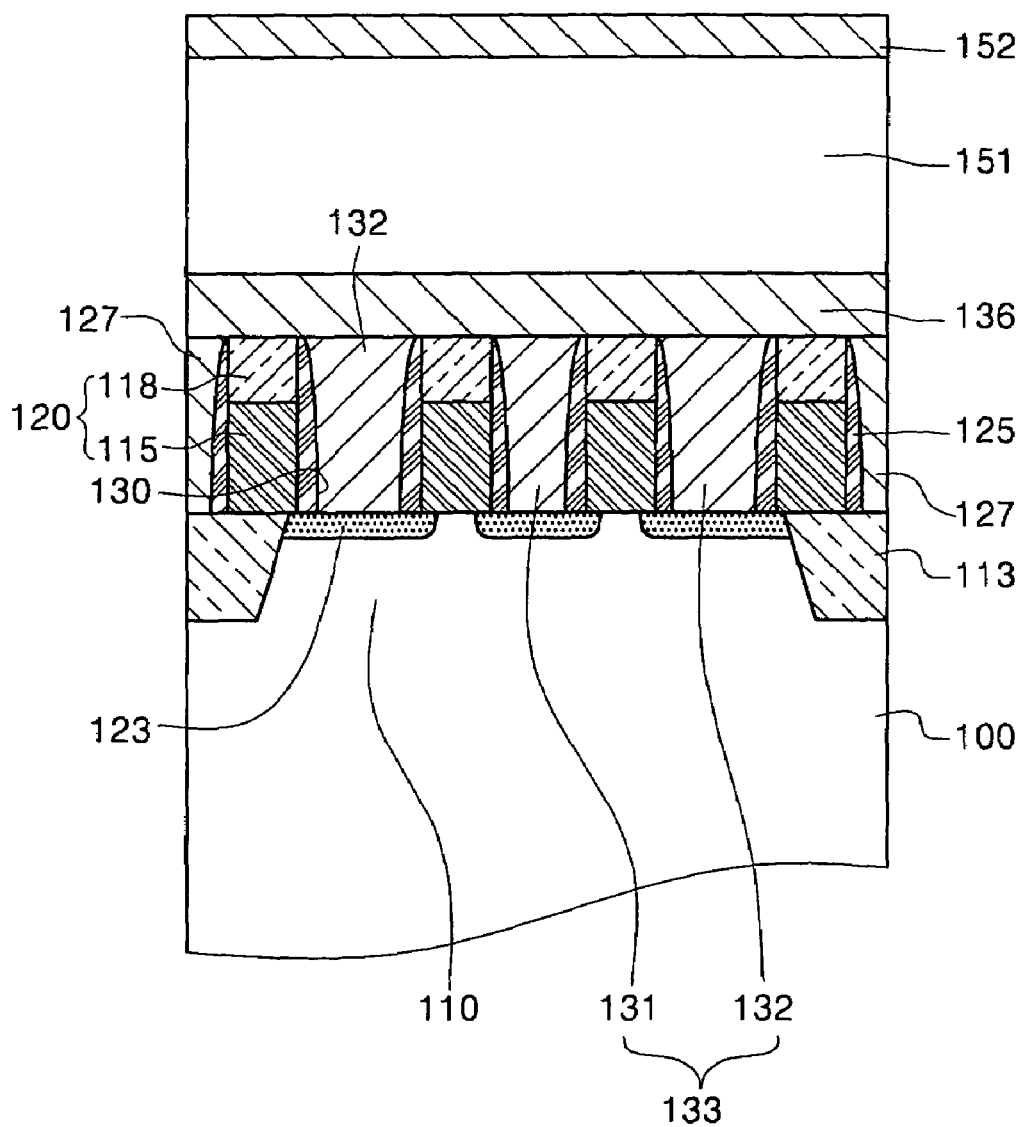

Referring to FIGS. 6 and 7, a bit line interlayer insulating layer 136 is formed over the semiconductor substrate 100 having the landing pads 133, and a plurality of bit line patterns 150 are formed in parallel on the bit line interlayer insulating layer 136. Each of the bit line patterns 150 includes a bit line 143 and a bit line capping layer pattern 146 stacked in sequence. Preferably, the bit line 143 is formed of a tungsten W layer, and the bit line capping layer pattern 146 is formed of a silicon nitride layer. A buried interlayer insulating layer(not shown) is formed to a predetermined thickness sufficient for covering the bit line patterns 150. A planarization process is performed by using a chemical mechanical polishing process on the buried interlayer insulating layer to expose the top surface of the bit line capping layer pattern 146, thereby forming line insulating layer patterns 151. The line insulating layer pattern 151 is formed of an insulating layer having an etching selectivity ratio different from the bit line capping layer pattern 146 but having the same etching selectivity ratio as the bit line interlayer insulating layer 136, for example an oxide layer. A hard mask layer 152 is formed over the semiconductor substrate 100 having the line insulating layer pattern 151. The hard mask layer 152 is formed of an insulating layer having an etching selectivity ratio different from the bit line capping layer pattern 146 and the line insulating layer pattern 151. The hard mask layer 152 is preferably formed of a doped or non-doped poly silicon layer. However, the hard mask layer 152 can be formed of an insulating layer having the same etching selectivity ratio as the bit line capping layer pattern 146 but an etching selectivity ratio different from the line insulating layer pattern 151. In this case, the hard mask layer 152 is preferably formed of a silicon nitride layer.

Figure 8:
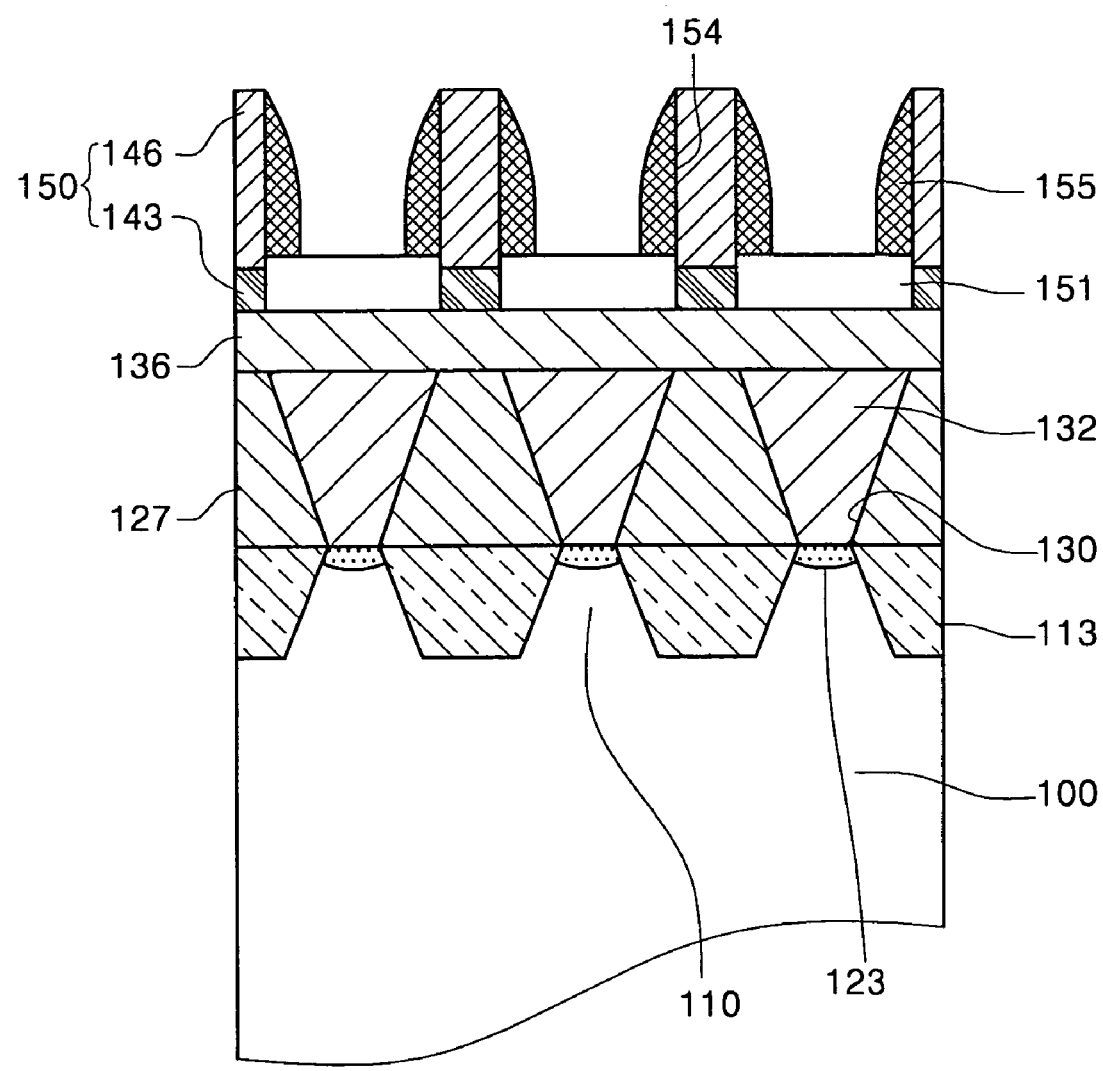
Figure 9:
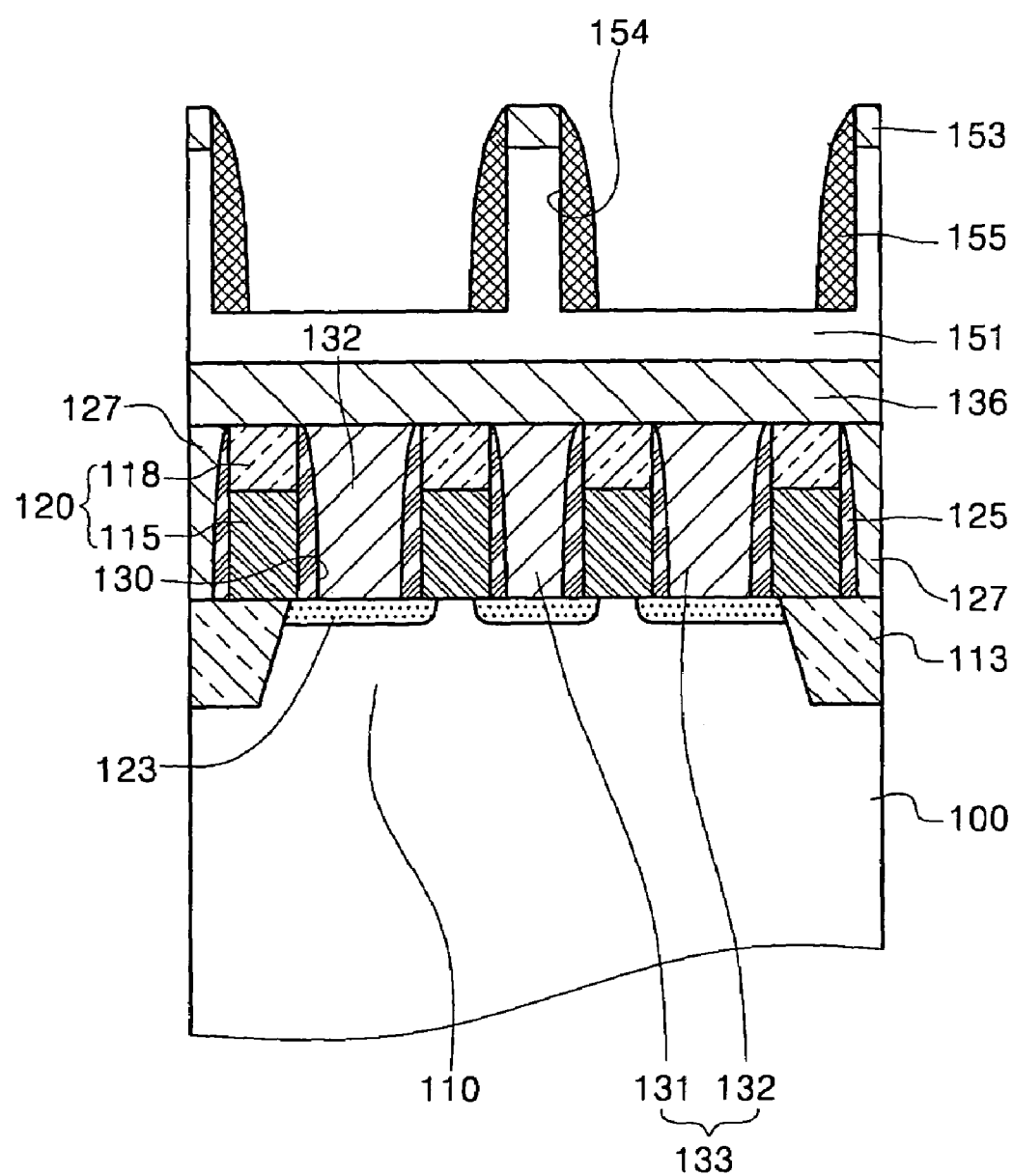

Referring to FIGS. 8 and 9, a plurality of hard mask patterns 153 are formed over the semiconductor substrate 100 having the line insulating layer patterns 151 and the bit line pattern 150. Here, the hard mask patterns 153, as shown in FIG. 1, are formed in the direction perpendicular to the bit line pattern 150 to overlap the bit line landing pads 131. The formation of the hard mask patterns 153 includes forming a silicon nitride layer on the whole surface of the semiconductor substrate having the bit line patterns 150 and the line insulating layer pattern 151, and patterning the silicon nitride layer in the direction perpendicular to the bit line patterns 150 so that the silicon nitride layer is placed over the bit line landing pads 131. Also, the formation of the hard mask patterns 153 may include forming a poly silicon layer over the whole surface of the semiconductor substrate having the bit line patterns 150 and the line insulating layer pattern 151 and patterning the poly silicon layer in the direction perpendicular to the bit line patterns 150 so that the poly silicon layer is placed over the bit line landing pads 131. Using the hard mask patterns 153 and the bit line patterns 150 as an etching mask, the line insulating layer patterns 151 are partially etched to form upper contact holes 154 which expose upper side walls of the bit line patterns 150. Here, bottom surfaces of the upper contact holes 154 are placed higher than upper surfaces of the bit lines 143. Also, the upper contact holes 154 are formed such that a diameter exposed in the direction parallel to the bit line patterns 150 is greater than that exposed in the direction perpendicular to the bit line patterns 150. Contact hole spacers 155 are formed on side walls of the upper contact holes 154. The contact hole spacers 155 are formed of an insulating layer having an etching selectivity ratio different from the line insulating layer pattern 151. The contact hole spacers 155 is preferably formed of a silicon nitride layer. The formation of the contact hole spacers 155 comprises conformally forming a silicon nitride layer on the semiconductor substrate having the upper contact holes 154 and anisotropically etching the silicon nitride layer.

Figure 10:
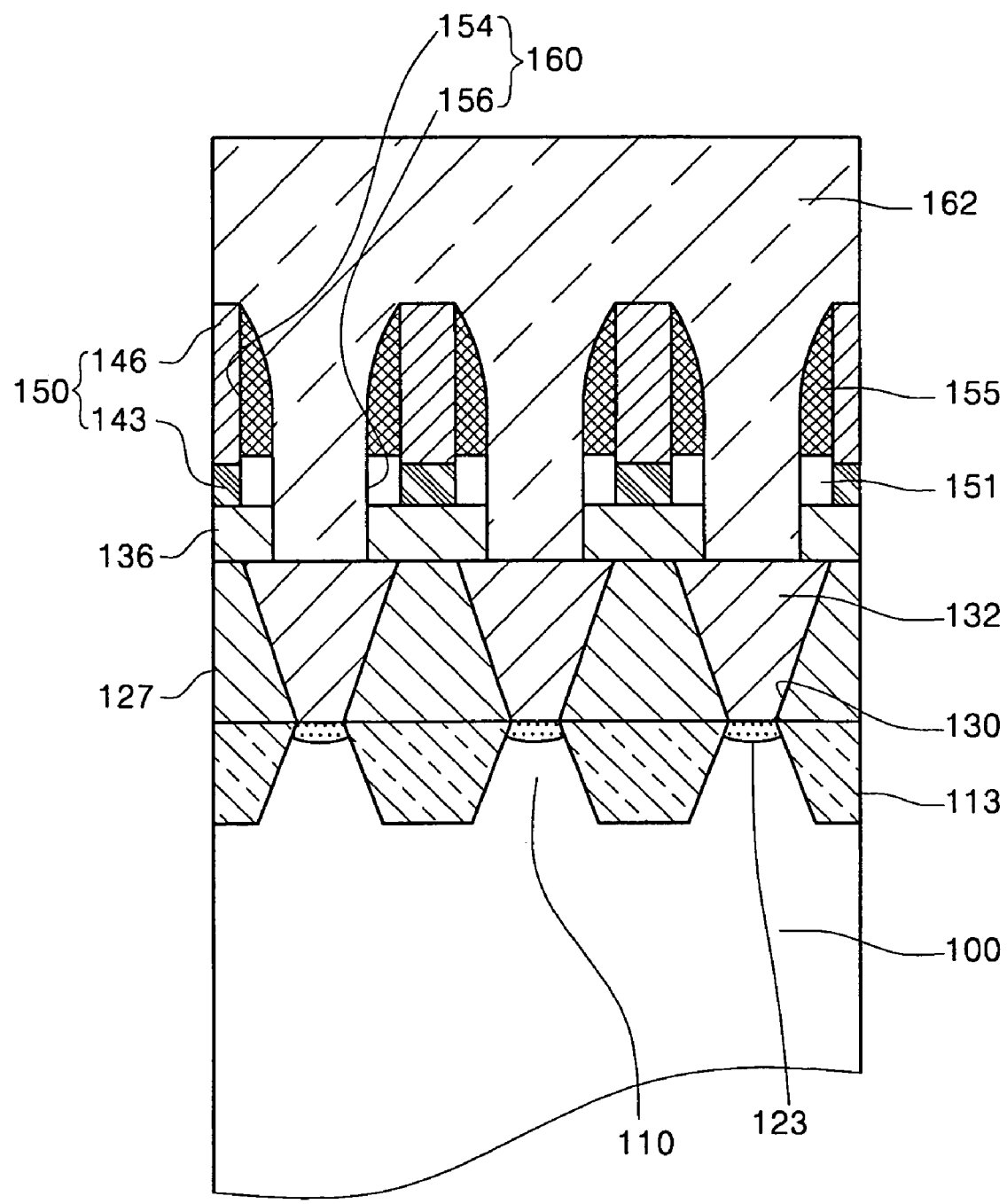
Figure 11:
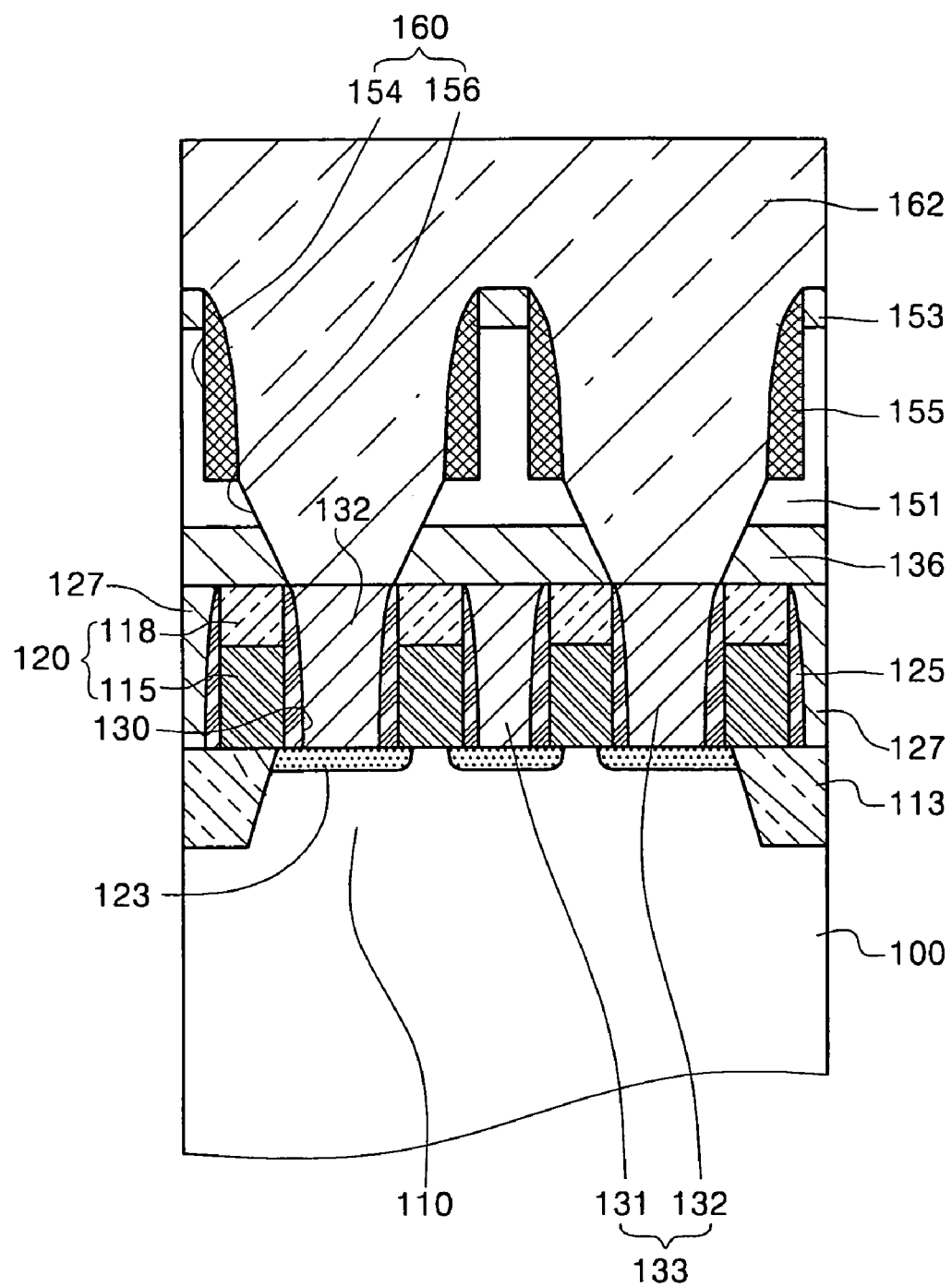

Referring to FIGS. 10 and 11, using the contact hole spacers 155, the bit line patterns 150 and the hard mask patterns 153 as an etching mask, portions of the line insulating pattern 151 and the bit line interlayer insulating layer 136 between the bit line patterns 150 are sequentially etched to form lower contact holes 156 below the upper contact holes 154, exposing the storage node landing pads 132. Each of the lower contact holes 156 has inclined side walls. The inclined side walls are formed because polymers generated by the reaction of an etching gas to the silicon nitride layer and the oxide layer stick to the line insulating layer pattern 151 and the bit line interlayer insulating layer 136 to thereby obstruct the line insulating layer pattern 151 and the bit line interlayer insulating layer 136 from being etched. The inclined side walls are formed only in the direction parallel to the bit line pattern 150. This is because diameters of the lower contact holes 156 formed in the direction parallel to the gate pattern 120 are relatively smaller than that of the lower contact holes 156 formed in the direction parallel to the bit line pattern 150 and, thus etching amount of the line insulating layer patterns 151 and the bit line interlayer insulating layer 136 is small in the direction parallel to the bit line pattern 150. If the inclined side walls can easily be formed, the upper contact holes 154 can be formed to penetrate the line insulating layer patterns 151. That is, the lower contact holes 156 having the inclined side walls can be formed by using only bit line interlayer insulating layer 136.

The upper and lower contact holes 154 and 156 constitute a buried contact hole 160. A storage node contact plug layer 162 is formed over the whole surface of the semiconductor substrate 100 having the buried contact hole 160. The storage node contact plug layer 162 is formed of a doped poly silicon layer.

Figure 12:
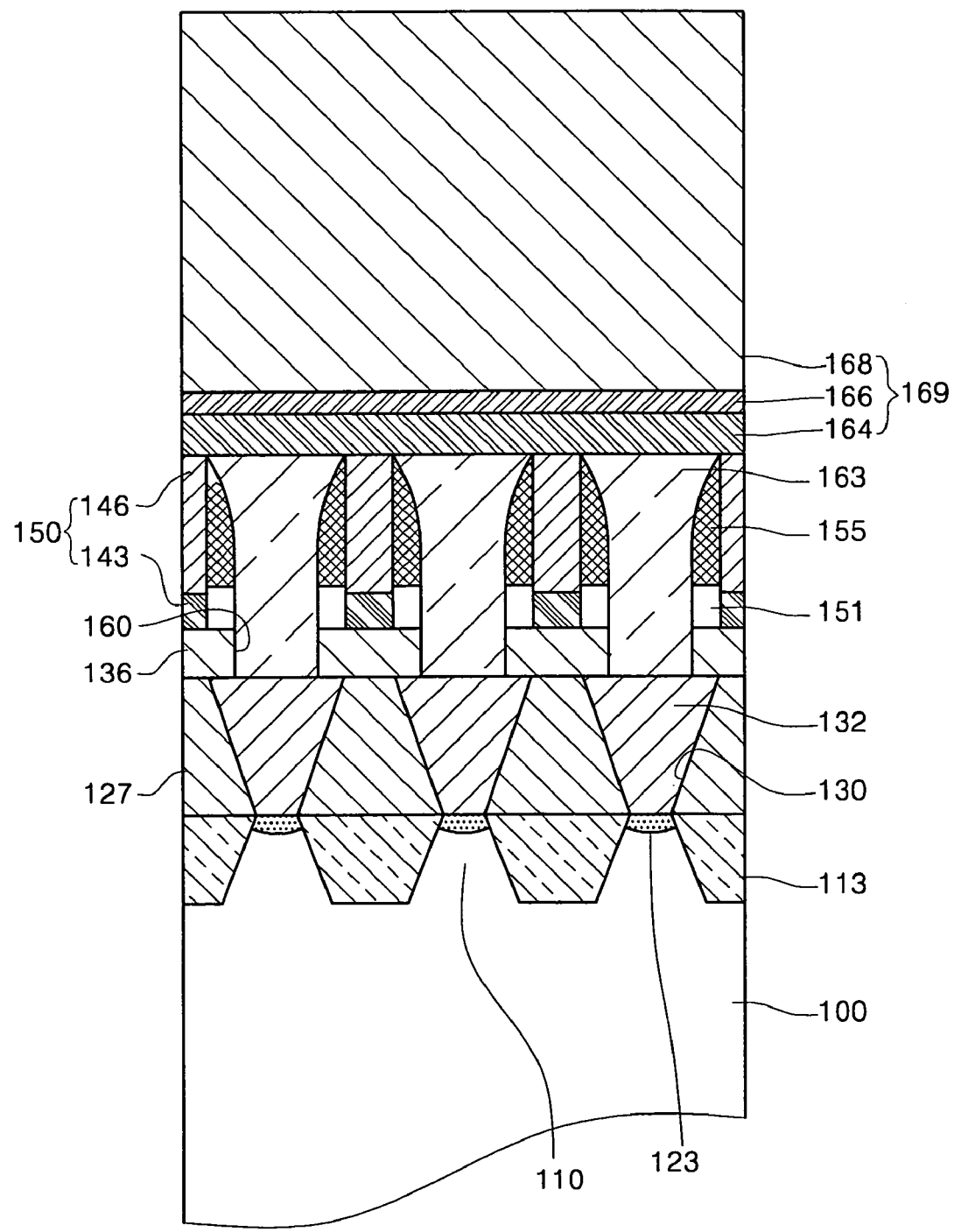
Figure 13:
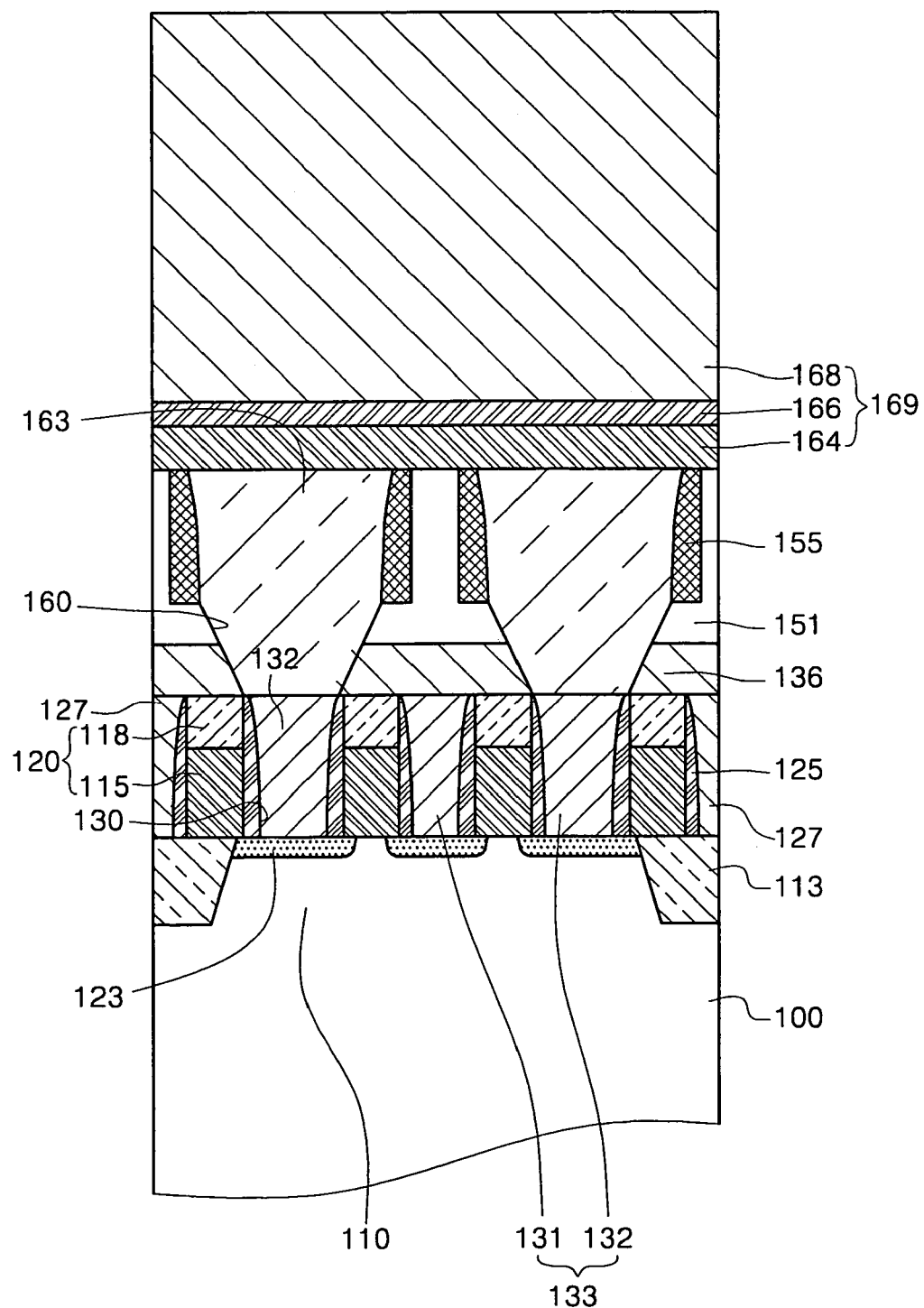

Referring to FIGS. 12 and 13, the storage node contact plug layer 162 is etched until the bit line capping layer pattern 146 is exposed together with removing the hard mask pattern 153, thereby forming a storage node contact plug 163. Here, the etching process is performed only when the hard mask patterns 153 have an etching selectivity ratio different from the bit line capping layer pattern 146. However, if the hard mask pattern 153 has the same etching selectivity ratio as the bit line capping layer pattern 146 but an etching selectivity ratio different from the line insulating layer pattern 151, the etching process is performed until the line insulating layer pattern 151 is exposed in order to form the storage node contact plug 163. The etching process is performed by using a chemical mechanical polishing technique. A storage node interlayer insulating layer 169 is formed over the whole surface of the semiconductor substrate 100 having the storage node contact plug 163. The storage node interlayer insulating layer 169 is formed from a protection layer 164, an etching stopper layer 166 and a molding layer 168 stacked in sequence. The protection layer 164 and the molding layer 168 are formed of an insulating layer having an etching selectivity ratio different from the etching stopper layer 166. This is because the etching stopper layer 166 prevents the storage node contact plugs 163 and the underlying layers 151, 153, 155 and 163, which are formed under the protection layer 164, from being overly etched. Preferably, the protection layer 164 and the molding layer 168 are formed of an oxide layer, and the etching stopper layer 166 is formed of a silicon nitride layer.

Figure 14:
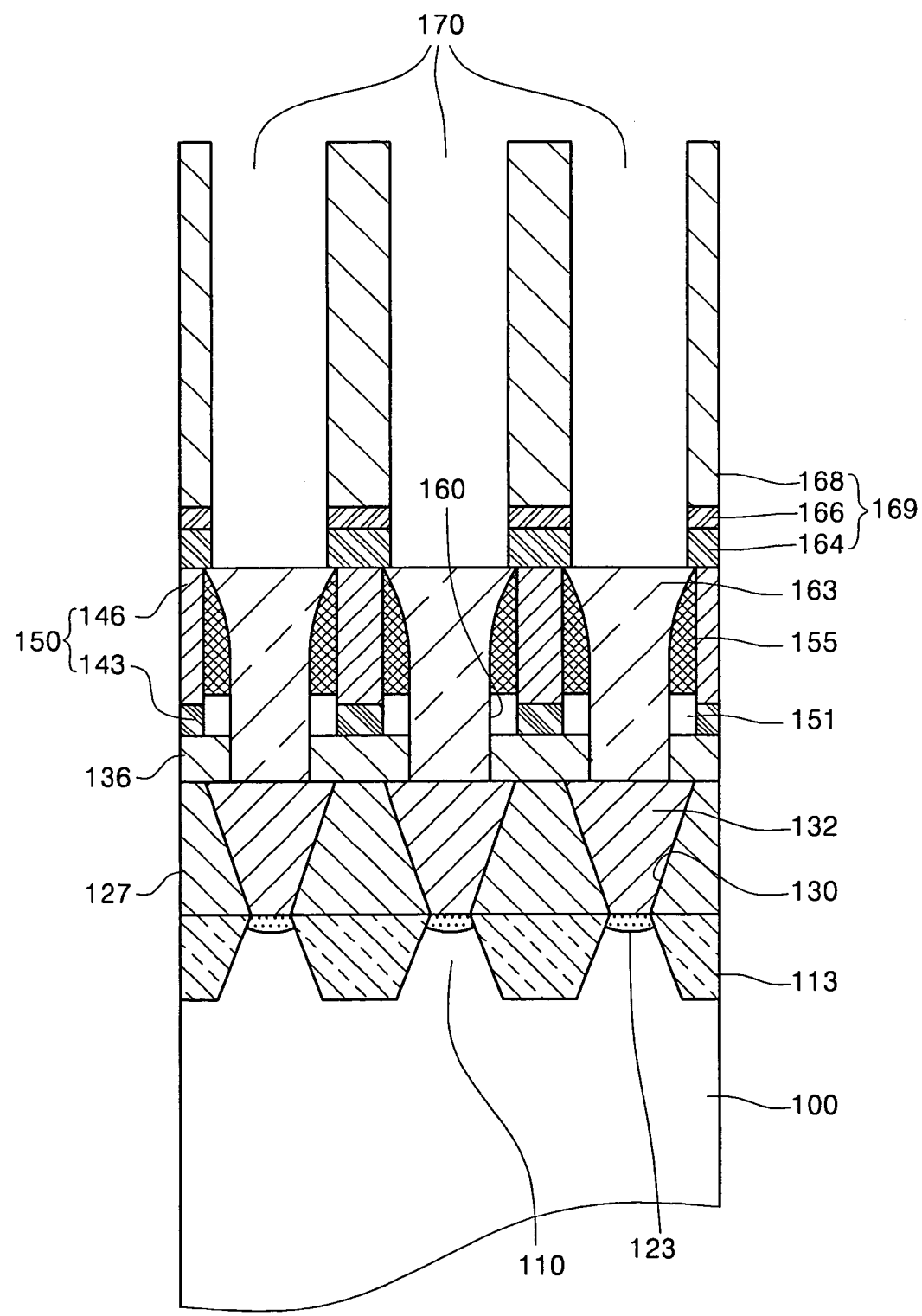
Figure 15:
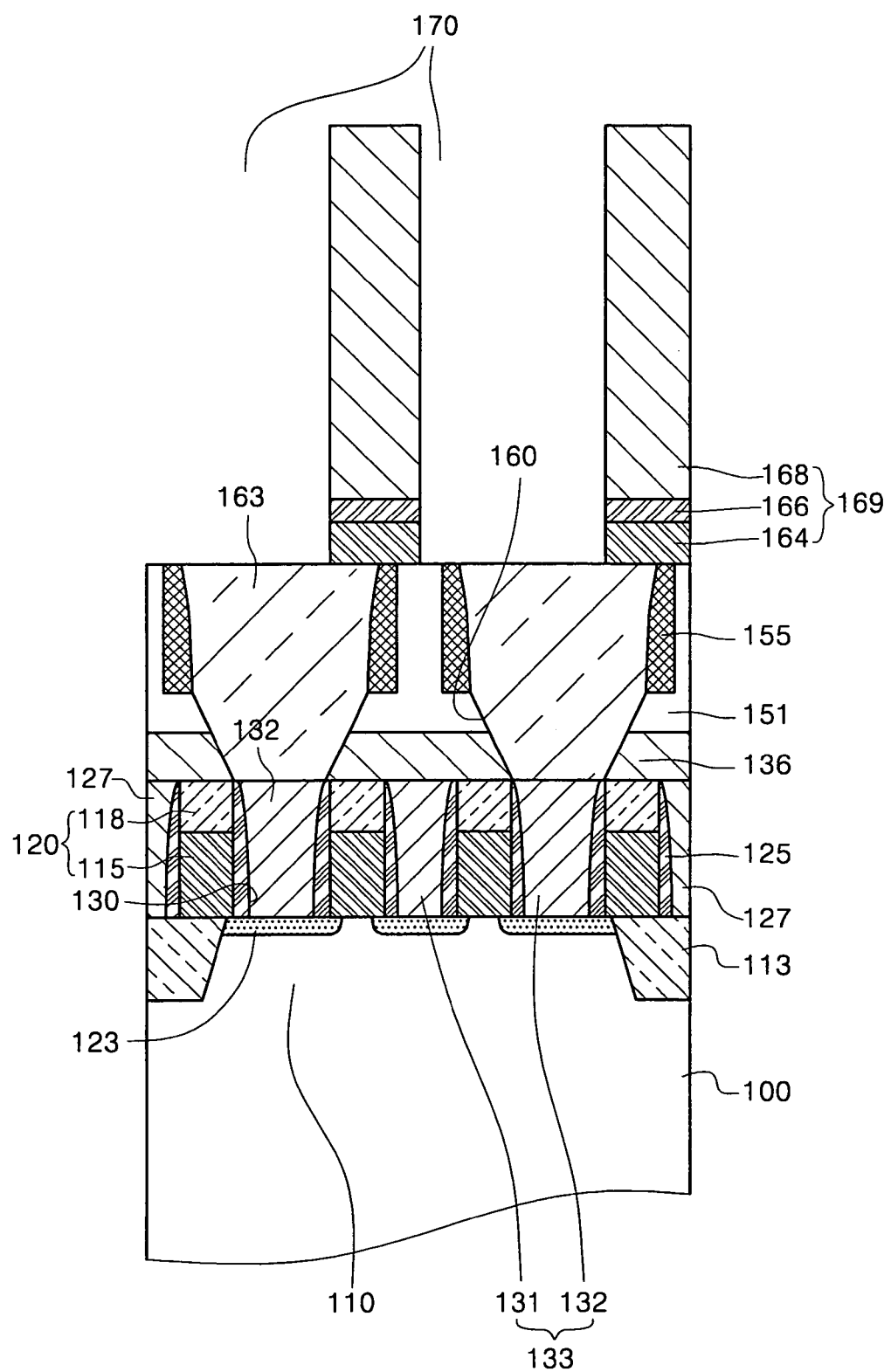

Referring to FIGS. 14 and 15, storage node holes 170 are formed to penetrate the storage node interlayer insulating layer 169. Here, the storage node holes 170 have a square shape or a diamond shape.

The semiconductor device having the storage node holes 170, as shown in FIG. 1, looks difficult to have upper surfaces of the storage node contact plugs 163 which are overlapped with the storage node holes 170 without changing location of the contact holes 160. However, since the upper contact holes 154 are formed as large as possible between the bit line patterns 150 when the contact holes are formed, the semiconductor device having the storage node holes 170 can have the upper surfaces of the storage node contact plugs 163 which are sufficiently overlapped with the storage node holes 170.

Figure 16:
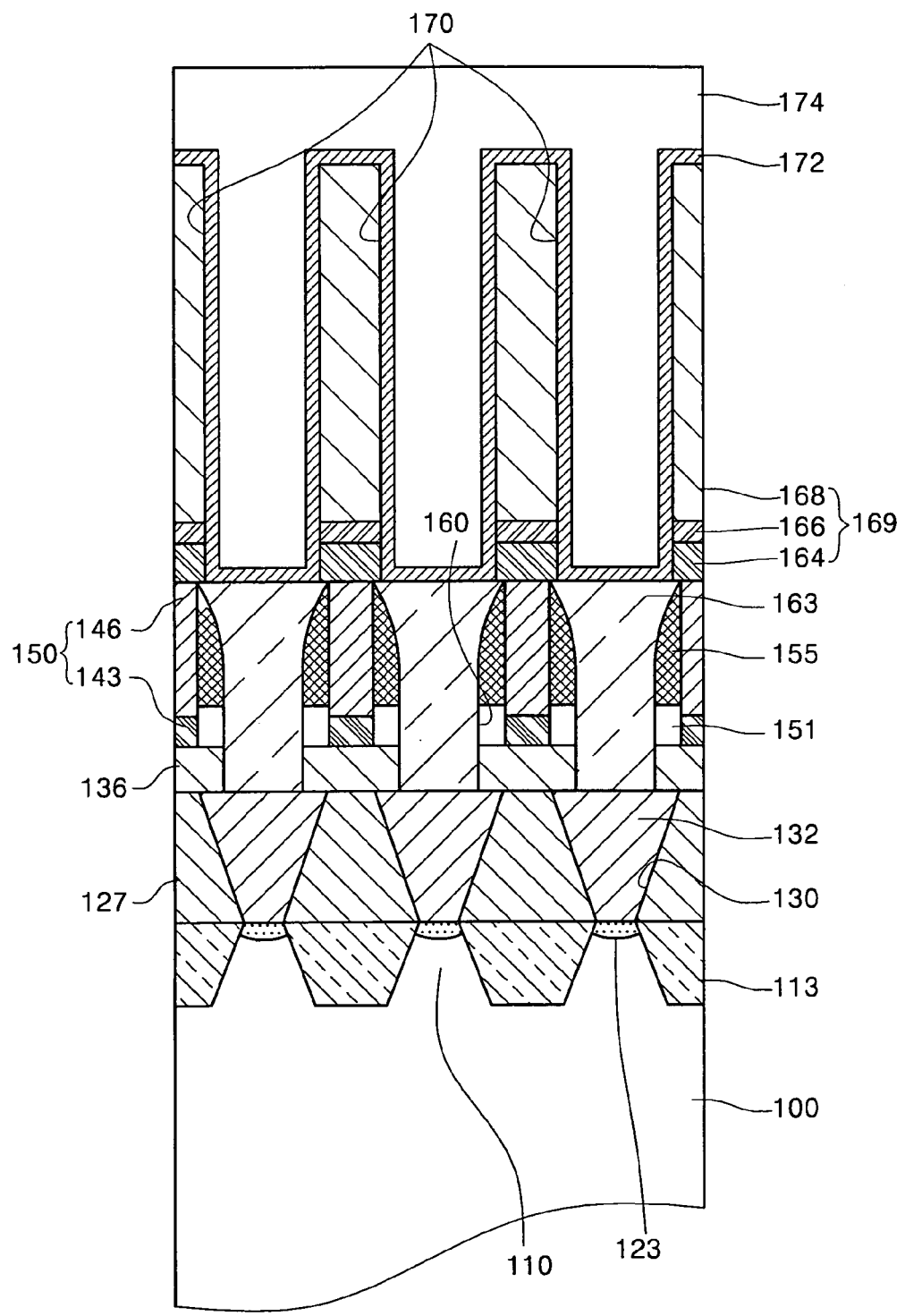
Figure 17:
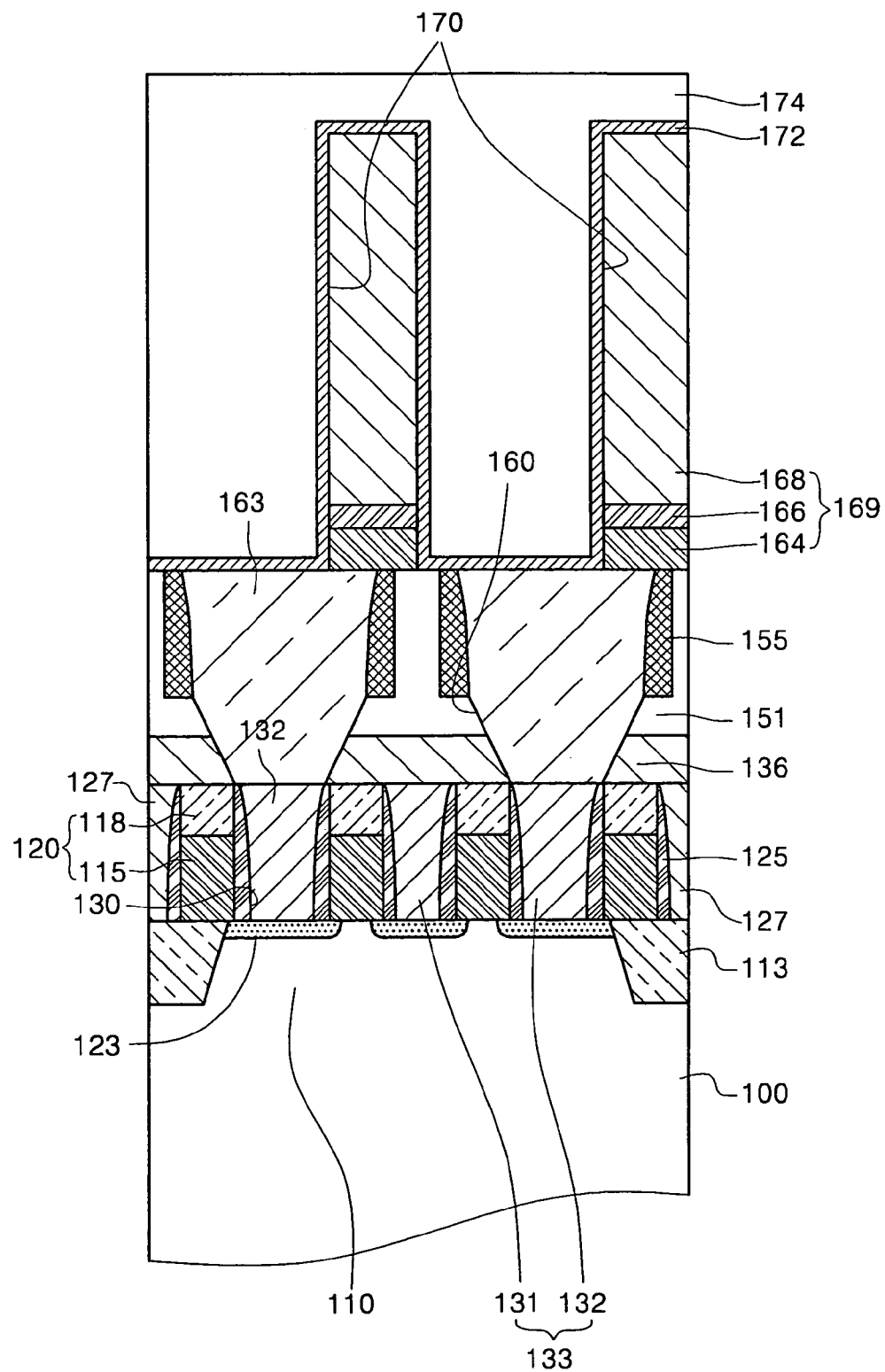

Referring to FIGS. 16 and 17, a storage node layer 172 and a sacrificial layer 174 are sequentially formed over the semiconductor substrate 100 having the storage node holes 170. Here, the sacrificial layer 174 fills the storage node holes 170 and has a predetermined thickness sufficient for covering the molding layer 168. The sacrificed layer 174 is preferably formed of an insulating layer having the same etching selectivity ratio as the molding layer 168 and the protection layer 164. The sacrificial layer 174 is formed of an oxide layer, and the storage node layer 172 is formed of a doped poly silicon layer.

Figure 18:
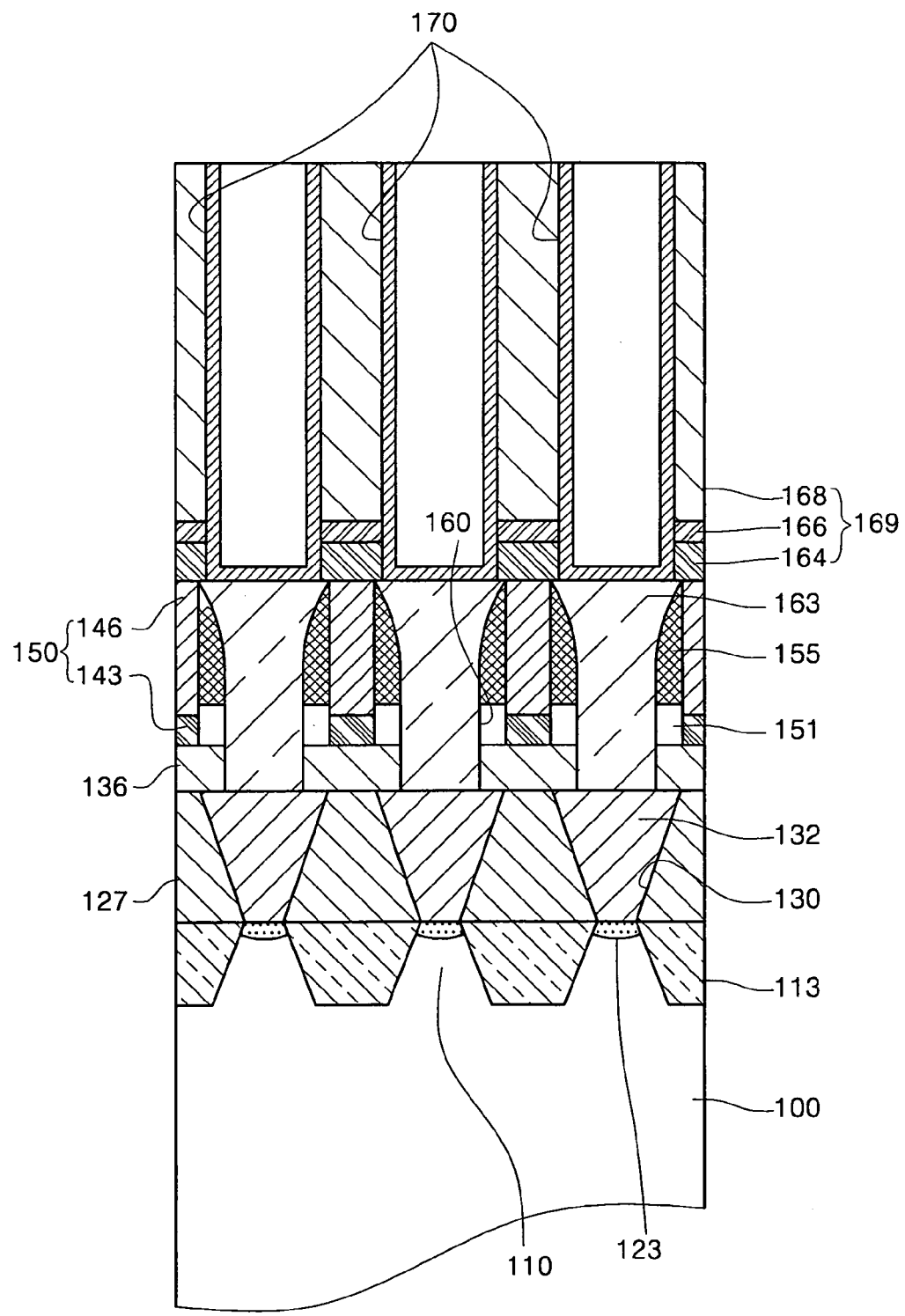
Figure 19:
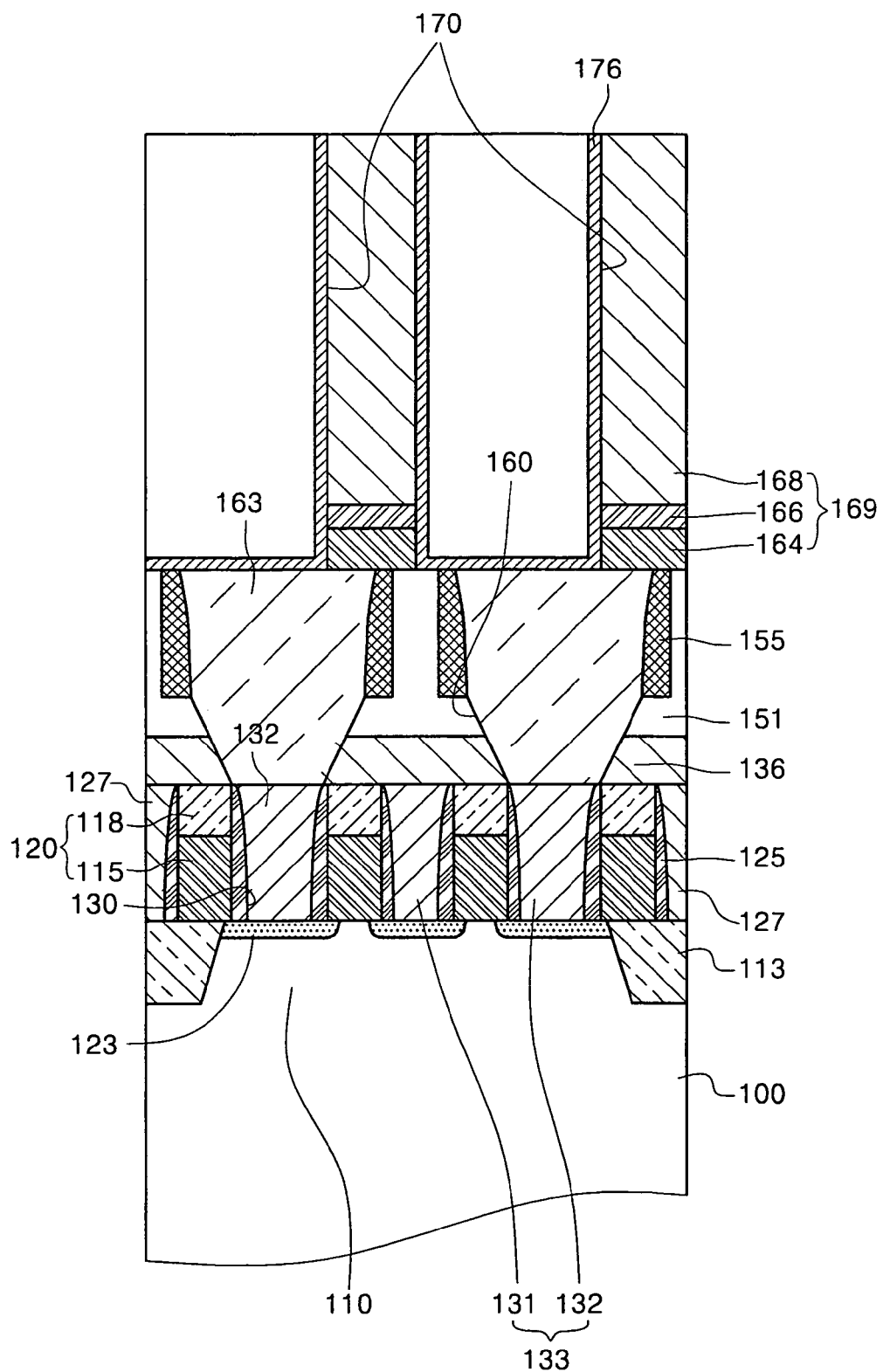

Referring to FIGS. 18 and 19, a planarization process is performed on the sacrificial layer 174 to expose the storage node layer 172, and then using the sacrificial layer 174 and the molding layer 168 as an etching buffer layer the storage node layer 172 is etched. The planarization process is performed by using a chemical mechanical polishing technique or an etching back technique. Here, the storage node layer 172 is etched to expose a top surface of the molding layer 168, thereby forming storage nodes 176. Each of the storage nodes 176 acts as a lower electrode of a capacitor.

As described herein before, according to an embodiment of the invention, the storage node holes sufficiently overlaps the storage node contact plugs at the junctions of the gate patterns and the bit line patterns. Therefore, a performance of the semiconductor device having the storage node holes can be improved together with the storage node contact plugs.

Embodiments of the invention will now be described in a non-limiting way.

According to an embodiment of the invention, there is provided a semiconductor device that includes bit line landing pads and storage landing pads placed on both sides of the bit line landing pads placed over a semiconductor substrate. Bit line landing pads and storage landing pads are placed on both sides of the bit line landing pads placed over a semiconductor substrate. A bit line interlayer insulating layer covers the whole surface of the semiconductor substrate having the bit line and storage landing pads. A plurality of bit line patterns are placed in parallel on the bit line interlayer insulating layer and each of bit line pattern includes a bit line and a bit line capping layer pattern. Line insulating layer patterns are placed on a top surface of the bit line interlayer insulating layer. Upper contact holes are placed in a predetermined region between the bit line patterns and higher than upper surfaces of the bit lines. Contact hole spacers covers the side walls of the upper contact holes. Lower contact holes are self-aligned with the upper contact holes to place them in the bit line interlayer insulating layer by penetrating between the line insulating layer patterns, thereby exposing the storage node landing pads. Storage node contact plugs fill the upper and lower contact holes.

In accordance with an embodiment of the invention, there is provided a method of fabricating a semiconductor device that includes forming bit line and storage node landing pads two-dimensionally over a semiconductor substrate. A bit line interlayer insulating layer is formed on the semiconductor substrate having the bit line and storage node landing pads. A plurality of bit line patterns are formed in parallel on the bit line interlayer insulating layer. Line insulating layer patterns fill gap regions between the bit line patterns. A plurality of hard mask patterns traverses the bit line patterns over the semiconductor substrate having the line insulating layer patterns and the bit line patterns. The line insulating layer patterns are partially etched, using the hard mask patterns and the bit line patterns as etching masks, to form upper contact holes which expose side walls of the bit line patterns. Contact hole spacers are formed on the side walls of the upper contact holes. The line insulating patterns and the bit line interlayer insulating layer are sequentially etched by using the contact hole spacers, the hard mask patterns and the bit line patterns as an etching mask to form lower contact holes which expose the storage node landing pads. Storage node contact plugs are formed to fill the upper and lower contact holes.

While the invention has been particularly shown and described with reference to exemplary embodiments thereof, it will be understood by those skilled in the art that the foregoing and other changes in form and details may be made therein without departing from the spirit and scope of the invention as defined in the following claims.

What is claimed is:

1. A method of manufacturing a semiconductor device, comprising:
    forming bit line and storage node landing pads over a semiconductor substrate;
    forming a bit line interlayer insulating layer overlying the bit line and storage node landing pads;
    forming a plurality of bit line patterns on the bit line interlayer insulating layer;
    forming line insulating layer patterns filling gap regions between the bit line patterns;
    forming a plurality of hard mask patterns traversing the bit line patterns over the line insulating layer patterns and the bit line patterns;
    partially etching the line insulating layer patterns by using the hard mask patterns and the bit line patterns as an etching mask to form upper contact holes which expose side walls of the bit line patterns;
    forming contact hole spacers on the side walls of the upper contact holes;
    sequentially etching the line insulating patterns and the bit line interlayer insulating layer, using the contact hole spacers, the hard mask patterns and the bit line patterns as an etching mask to form lower contact holes which expose the storage node landing pads; and
    forming storage node contact plugs filling the upper and lower contact holes.

2. The method of claim 1, wherein the formation of the line insulating layer patterns comprises
    forming a buried interlayer insulating layer overlying the bit line patterns; and
    planarizing the buried interlayer insulating layer to expose upper surfaces of the bit line patterns.

3. The method of claim 1, wherein the formation of the hard mask patterns comprises
    forming a poly silicon layer overlying the bit line patterns and the line insulating layer pattern; and
    patterning the poly silicon layer in a direction perpendicular to the bit line patterns to place over the bit line landing pads.

4. The method of claim 1, wherein the formation of the hard mask patterns comprises
    forming a silicon nitride layer on the bit line patterns and the line insulating layer pattern; and
    patterning the silicon nitride layer in the direction substantially perpendicular to the bit line patterns to place over the bit line landing pads.

5. The method of claim 1, wherein the formation of the contact hole spacers comprises:
    conformally forming a silicon nitride layer overlying the upper contact holes; and
    anisotropically etching the silicon nitride layer.

6. The method of claim 1, wherein the formation of the lower contact holes comprises etching the line insulating patterns and the bit line interlayer insulating layer sequentially through the upper contact holes by using polymers generated by a reaction of an etching gas to the contact hole spacers, the line insulating layer patterns and the bit line interlayer insulating layer.

7. The method of claim 1, wherein the formation of the storage node contact plug comprises:
    forming a doped poly silicon layer to a predetermined thickness sufficient for filling the upper and lower contact holes on the hard mask patterns; and
    planarizing the doped poly silicon layer to remove the hard mask patterns and to expose top surfaces of the bit line patterns.

* * * * *